US009373410B1

(12) United States Patent
Kumar

(10) Patent No.: US 9,373,410 B1
(45) Date of Patent: Jun. 21, 2016

(54) MLC OTP OPERATION IN A-SI RRAM

(71) Applicant: Crossbar, Inc., Santa Clara, CA (US)

(72) Inventor: Tanmay Kumar, Pleasanton, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/479,111

(22) Filed: Sep. 5, 2014

Related U.S. Application Data

(63) Continuation-in-part of application No. 14/341,726, filed on Jul. 25, 2014.

(51) Int. Cl.
| G11C 17/00 | (2006.01) |
| G11C 17/14 | (2006.01) |
| H01L 45/00 | (2006.01) |
| G11C 17/08 | (2006.01) |
| G11C 13/00 | (2006.01) |

(52) U.S. Cl.
CPC ............... *G11C 17/146* (2013.01); *G11C 17/08* (2013.01); *H01L 45/06* (2013.01); *H01L 45/14* (2013.01); *G11C 13/0004* (2013.01); *G11C 13/0069* (2013.01); *G11C 17/00* (2013.01)

(58) Field of Classification Search
CPC ............... G11C 17/16; G11C 13/0002; G11C 13/0004; G11C 13/0069; G11C 17/165; G11C 13/0011; G11C 17/00
USPC ...................... 365/100, 94, 96, 158, 163, 148
See application file for complete search history.

(56) References Cited

U.S. PATENT DOCUMENTS

| 7,499,304 | B2 * | 3/2009 | Scheuerlein | G11C 17/16 365/148 |
| 7,538,338 | B2 | 5/2009 | Rinerson et al. | |
| 8,159,857 | B2 * | 4/2012 | Gammel | G11C 13/0059 365/148 |
| 8,675,387 | B2 * | 3/2014 | Ikeda | G11C 13/0002 365/148 |
| 2006/0250837 | A1 | 11/2006 | Herner et al. | |
| 2013/0043452 | A1 | 2/2013 | Meyer et al. | |
| 2013/0062587 | A1 | 3/2013 | Lee et al. | |
| 2014/0192589 | A1 | 7/2014 | Maxwell et al. | |
| 2014/0293678 | A1 | 10/2014 | Orlowski et al. | |
| 2015/0129829 | A1 | 5/2015 | Kumar | |

OTHER PUBLICATIONS

Office Action dated Sep. 17, 2015 for U.S. Appl. No. 14/341,726, 19 pages.
Lee, et al., "Resistance switching of Al doped ZnO for Non Volatile Memory Applications", Non Volatile Semiconductor Memory Workshop, 2006, pp. 86-87, IEEE.
Office Action dated Apr. 22, 2016 for U.S. Appl. No. 14/341,726, 25 pages.

* cited by examiner

*Primary Examiner* — David Lam
(74) *Attorney, Agent, or Firm* — Amin, Turocy & Watson, LLP

(57) ABSTRACT

Providing for a memory cell capable of operating a one time programmable, multi-level cell memory is described herein. In some embodiments, a program signal having a first polarity and a first current compliance is applied to a memory cell. In an aspect, the memory cell is switched to a first program state from a non-program state in response to the first program signal. Furthermore, in an embodiment, an additional program signal having a second polarity is applied to the memory cell. In another aspect, the memory cell is switched to an additional program state different from the first program state in response to the additional program signal, wherein: the memory cell inherently resists switching back from the additional program state to the first program state, and the second polarity is opposite to the first polarity.

20 Claims, 13 Drawing Sheets

MLC OTP OPERATION IN A-SI RRAM

CROSS-REFERENCE TO RELATED APPLICATIONS

This application claims priority to and is a continuation in part of U.S. patent application Ser. No. 14/341,726 filed on Jul. 25, 2014 entitled, "MLC OTP OPERATION WITH DIODE BEHAVIOR IN ZNO RRAM DEVICES FOR 3D MEMORY." The entirety of this application is incorporated herein by reference, for all purposes.

TECHNICAL FIELD

This disclosure generally relates to a memory cell; for example, the disclosure describes the operation of a one time programmable, multi-level cell memory and application of program signals of varying polarity to the memory cell.

BACKGROUND

The inventors of the present disclosure have been focusing research in the area of resistive memory within the field of integrated circuit technology. While much of resistive memory technology is in the development stage, various technological concepts for resistive memory have been demonstrated by the inventors, and are in one or more stages of verification to prove or disprove associated theory(ies). The inventors believe that resistive memory technology promises to hold substantial advantages over semiconductor transistor-based technologies in the electronics industry.

The semiconductor transistor has been the basis of electronic memory and processing devices for the past several decades. Over time, advancement in technology has roughly followed Moore's Law, which predicts an increase in a number of semiconductor devices, such as transistors, that can be fabricated on a given geometric area of a semiconductor chip. One implication of increasing number of semiconductor devices is increasing memory capacity and processing power for the semiconductor chip and associated electronic devices. Moore's Law has been fairly accurate at predicting the advancement of semiconductor technology up to the present.

The inventors of the disclosed subject matter have worked with two-terminal memory devices, such as resistive memory, as a replacement for three-terminal semiconductor transistors. Based on their experience in the field, mathematical predictions and test results, the inventors believe that two-terminal memory devices can overcome drawbacks of three-terminal semiconductor transistors in various categories related to performance and reliability. Examples include write, erase and access times, data reliability, device density, and others. Accordingly, the inventors are in the process of discovering new ways to create or operate two-terminal memory technologies and how they can replace conventional micro electronic systems and devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure provide a method of operating a multi-level cell memory to achieve one-time programmable functionality. In some embodiments, the method can comprise applying a program signal having a first polarity and a first current compliance to a memory cell. Furthermore, the method can comprise switching the memory cell to a first program state from a non-program state in response to the first program signal. Also, in an aspect, the method can comprise applying an additional program signal having a second polarity to the memory cell. In another aspect, the memory cell can be switched to an additional program state different from the first program state in response to the additional program signal. Furthermore, in an aspect, the memory cell inherently resists switching back from the additional program state to the first program state. Also, the method can comprise the second polarity as opposite to the first polarity.

In one or more additional embodiments, the subject disclosure can provide an electronic device comprising an array of memory cells comprising a substrate having a complementary semiconductor metal oxide device and a one-time programmable (OTP) multi-level cell (MLC) two-terminal memory cell, the OTP MLC two-terminal memory cell being formed as a third dimension device above an upper surface of the substrate, wherein the memory is configured to store instructions related to operating the electronic device. Further, in an aspect, the electronic device can comprise a command interface, e.g. control registers, etc. configured to receive an instruction or signal pertaining to performing a memory operation with respect to the array of memory cells.

Moreover, the electronic device can comprise a controller configured to execute the memory-altering operation on the OTP MLC two-terminal memory cell via one or more signal inputs in response to receipt of the instruction at the command interface and processing of the command. In an aspect, the memory operation of the electronic device can further comprise applying a first program signal with a first polarity to the OTP MLC two-terminal memory cell and verifying the OTP MLC two-terminal memory cell is in a first program state in response to the first program signal. In another aspect, the memory operation of the electronic device can comprise applying a second program signal with a second polarity opposite the first polarity to the OTP MLC two-terminal memory cell and verifying the OTP MLC two-terminal memory cell is in a second program state in response to the second program signal.

In further embodiments, the subject disclosure provides a method of programming a one time programmable, multi-level cell memory. The method can comprise applying a first program signal to a OTP MLC memory having a first polarity and a first current compliance configured to cause a state change in the OTP MLC memory to a first program state from a non-program state. Moreover, the method can comprise applying a second program signal to the OTP MLC memory having a second polarity and a second current compliance configured to cause a state change in the OTP MLC memory to a second program state from the first program state. Moreover, the method can comprise applying a third program signal to the OTP MLC memory having the first polarity and a third current compliance configured to cause a state change in the OTP MLC memory to a third program state from the second program state. In an aspect, the memory cell can switch to the third program state different from the second program state in response to the third program signal. In various embodiments, the memory cell can comprise a monolithic stack constructed above a substrate, can resist deprogramming, and further the second polarity can be opposite to the first polarity.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1A:
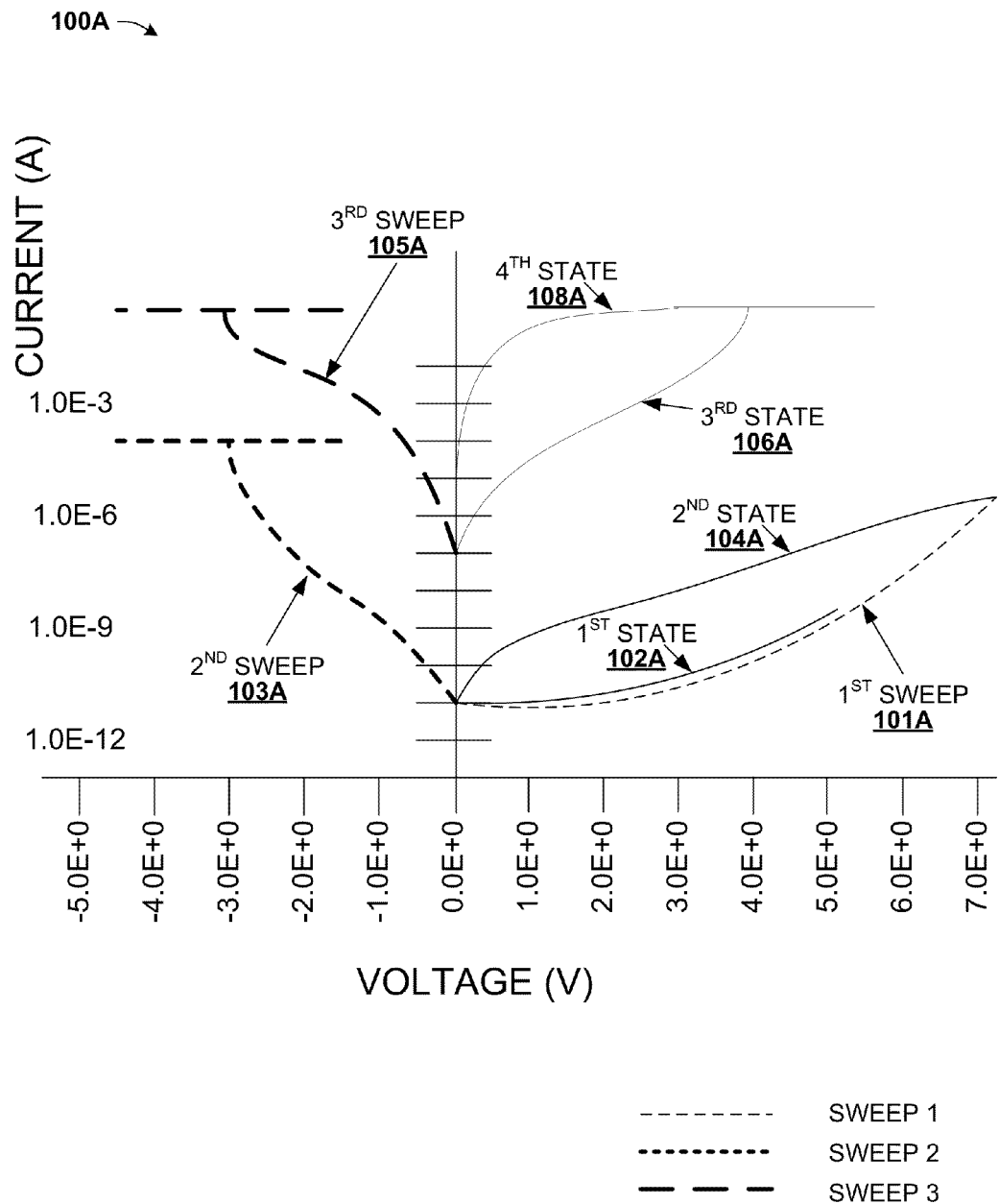
FIG. 1A depicts a flowchart of a sample method for operating a one-time programmable, multi-level cell memory in one or more additional embodiments.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a pulse width, a voltage or current polarity, or the like, or a suitable combination thereof. An example of a resistive switching two-terminal memory device, though not exhaustive, can include a resistive random access memory (RRAM).

Embodiments of the subject disclosure can provide a filamentary-based memory cell. One example of a filamentary-based memory cell can comprise: a p-type (or n-type) silicon (Si) bearing layer (e.g., p-type or n-type polysilicon, p-type or n-type polycrystalline SiGe, etc.), a resistive switching layer (RSL) and an active metal layer capable of being ionized or generating ions (e.g., at a boundary of the RSL and the active metal layer upon application of a voltage). Under suitable conditions, the active metal layer can provide filament-forming ions to voids or defects in the RSL. The p-type or n-type Si bearing layer can include a p-type or n-type polysilicon, p-type or n-type polycrystalline SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), non-crystalline silicon layer, and so forth. Other examples of materials suitable for the RSL could include $Si_XGe_YO_Z$ (where X, Y and Z are respective suitable positive integers), a silicon oxide (e.g., $SiO_N$, where N is a suitable positive integer), $HfO_C$ (where C is a suitable positive integer), $TiO_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations (e.g. two or more active metal layers) can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the present application are of the opinion that two-terminal memory devices, such as resistive-switching memory devices, have various advantages in the field of electronic memory. For example, resistive-switching technology can generally be small, consuming silicon area on the order of $4F^2$ per adjacent resistive-switching device for a single bit device (e.g., a memory cell comprising two resistive-switching devices would therefore be approximately $8F^2$ if constructed in adjacent silicon space), where F stands for the minimum feature size of a specific technology node. Non-adjacent resistive-switching devices, e.g., stacked above or below each other, can consume as little as $4F^2$ for a set of multiple non-adjacent devices. Moreover, multi-bit devices having two, three or more bits per memory cell can result in even greater densities in terms of bits per silicon area consumed. These advantages can lead to great semiconductor component density and memory density, and low manufacturing costs for a given number of digital storage bits. The inventors also believe that resistive-switching memory can exhibit fast programming speed and low programming current, and smaller cell sizes enabling greater component densities. Other benefits include non-volatility, having the capacity to store data without continuous application of power, and capacity to be built between metal interconnect layers, enabling resistive-switching based devices to be usable for two-dimension as well as three-dimension semiconductor architectures.

To program a filamentary-based resistive-switching memory cell, a suitable program voltage can be applied across the memory cell causing a conductive filament to form within a relatively high electrical resistance portion of the memory cell. This causes the memory cell to change resistive states, e.g. from a relatively high resistive state, to a relatively low resistive state, representing a bit of digital information. In some resistive-switching devices, an erase process can be implemented to deform the conductive filament, at least in part, causing the memory cell to return to the high resistive state from the low resistive state. In various embodiments of the subject disclosure, a memory cell can have a resistance to erasing or de-programming of the memory cell. This resistance can, within operating parameters of the memory cell, facilitate programming the memory cell, while mitigating or avoiding erasure of the memory cell. This operation is also referred to as a one-time programmable (OTP) memory operation, with which the memory cell can be programmed (e.g., from a non program state to a program state) or further programmed (e.g., from a first program state to a second program state), but not erased or de-programmed (e.g., to the non program state, or to the first program state from the second program state, etc.).

Further to the above, a multi-level cell (MLC) memory device can store one of multiple bits of digital information. The inventors of the subject application believe that multiple bit storage can be accomplished, in the context of resistive-switching media for instance, in response to multiple filament states (e.g., represented by distinct widths or lengths of a filament, distinct current density(ies), or the like) that exhibit distinct electrical characteristics. For instance, a first filament state can exhibit a first electrical characteristic (e.g., a first current value, a first resistance value, a first voltage value, etc.), a second filament state can exhibit a second electrical characteristic measurably distinct from the first electrical characteristic, and so on. According to various digital information models, the number of filament states can be related to the number of digital bits that can be stored by the resistive switching device. In one example digital information model, the number of digital bits Y can be related to the number of filament states X by the following relationship:

$$X=2^Y.$$

According to this relationship, a memory cell capable of storing two digital bits can be achieved with four distinct filament states, a memory cell capable of storing three digital bits can be achieved with eight distinct filament states, and so on.

Referring now to the drawings, FIG. 1A illustrates a current versus voltage (I-V) graph illustrating measurably distinct program states of a disclosed memory cell, in response to application of suitable program signals. The program signals can be of varying polarities to result in various responses, each response respectively observing a different program state. Referring to FIG. 1A, graph 100A represents various program states of a one-time programmable (OTP), multi-level cell (MLC) two-terminal memory device, and example voltage sweeps for implementing respective ones of the program states. In an aspect, a method of operating a one time programmable, multi-level cell memory, can comprise: applying a program signal having a first polarity and a first current compliance to a memory cell; switching the memory cell to a first program state from a non-program state in response to the first program signal; applying an additional program signal having a second polarity to the memory cell; and switching the memory cell to an additional program state different from the first program state in response to the additional program signal, wherein: the memory cell inherently resists switching back from the additional program state to the first program state, the second polarity is opposite to the first polarity. It should be appreciated that the voltage sweeps can represent example programming signals suitable to program respective ones of the program states for the MLC OTP two-terminal memory, and are not to be construed as exclusive for such programming signals. Various programming signals having respective suitable characteristics, including polarity, maximum voltage, current compliance, pulse width, number of pulses, or the like, or a suitable combination thereof, known in the art to be suitable for programming an MLC OTP two-terminal memory to respective ones of the program states, or made known to one of skill in the art by way of the context provided herein, are considered within the scope of the subject disclosure. Further, it should be appreciated that a MLC two-terminal memory cell(s) according to various embodiments can resist erasure or deprogramming thereof. Moreover, this resistance can exist without a separate rectifier component, such as a diode, or the like.

FIG. 1A depicts a graph 100A illustrating multiple programming states of a two-terminal memory cell (e.g., see FIGS. 1B, 1C, 1D, infra), according to one or more embodiments of the subject disclosure. Illustrated in graph 100A are multiple responses to multiple programming signals plotted as a function of voltage (horizontal-axis) and current conductance in Amperes (vertical axis). Accordingly, the graph depicts a programming state in voltage magnitude applied to the two-terminal memory cell as a function of current conductance of the two-terminal cell. For instance, a programming state can be displayed as a function of voltage versus current, field magnitude versus current, or the like, and can be applied in conjunction with operating an MLC OTP cell.

Figure 1B:
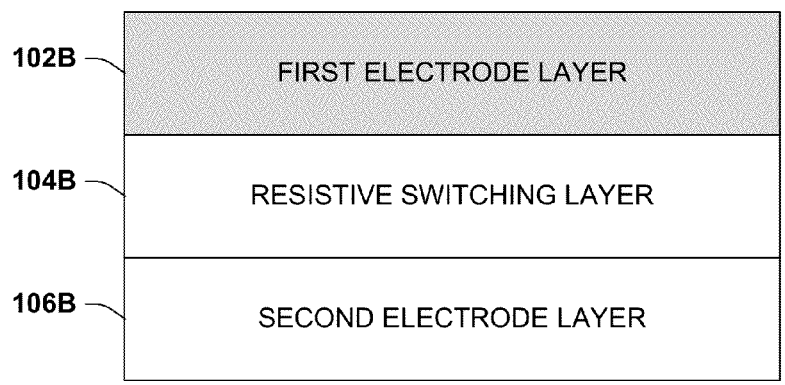
FIG. 1B depicts a non-limiting sample illustration of a two-terminal one-time programmable multi-level memory cell.

Referring now to FIG. 1B, depicted is a two-terminal memory cell 100B, comprised of a first electrode layer 102B, a resistive switching layer (or ion migration layer) 104B, and a second electrode layer 106B. For instance, in an embodiment, the first electrode layer 102B can comprise a silver (Ag), an aluminum (Al) material, or the like. (e.g., see FIG. 1C, infra, silver first electrode layer 102C). In an aspect, the resistive switching layer 104B can be formed of a material having high electrical resistance (e.g., compared with first electrode layer). In addition, resistive ion migration layer 104B can be permeable or partly permeable to ions of first electrode layer 102B. Suitable materials for resistive ion migration layer 104B can include a silicon material having defects or voids therein that are permeable to the ions, such as an amorphous silicon (e.g., see FIG. 1C, infra, e.g. amorphous silicon resistive ion migration layer 104C), a suitable silicon compound, a silicon germanium material, an oxide, a sub-oxide (e.g., $SiO_Z$, where Z is less than 2) a chalcogenide, or the like, or a suitable combination thereof. In another aspect, suitable materials for the second electrode layer 106B can comprise a conductive silicon (e.g., polycrystalline Si material) (e.g., see FIG. 1D, infra, doped silicon contact 106D), or silicon-germanium (SiGe) material (e.g., see FIG. 1C, infra, silicon germanium second electrode layer 106C). In an embodiment, the first electrode layer, e.g. Ag, Al, etc. electrode layer can be sputtered, evaporated, implanted, or co-sputtered with Si. Furthermore, in another embodiment, the second electrode layer may be conductive Si, SiGe, or can be an alloy comprising other metal(s).

In one or more disclosed embodiments, the combination of resistive switching layer 104B and first electrode layer 102B can form a bipolar resistive device. A bipolar resistive device can have a conductive filament formed in response to a suitable electric signal of a first polarity. The conductive filament can have an electrical characteristic(s) representative of a first program state. Furthermore, the conductive filament can be enhanced (e.g., lengthened, widened, selected ion density, selected current density—including decreased current density, relatively static or similar current density for differing current values at a common voltage, etc.) in response to a suitable electric signal of a second polarity opposite that of the first polarity, having an electrical characteristic(s) measurably distinct from the first program state and representative of the second program state. For instance, a suitable electric signal of the first polarity applied to a two-terminal memory cell can cause ions to flow from the first electrode layer to resistive ion migration layer 104B and form a conductive filament within resistive switching layer 104B. Moreover, this conductive filament can be resistant to de-formation of the conductive filament, thereby mitigating or avoiding erasure of the memory cell, once programmed. Resistance to filament de-formation can be intrinsic to the conductive filament itself, or to a resistive switching medium of the memory cell, and need not employ a separate rectifier device (e.g., a diode) to mitigate reverse polarity current, for instance.

A suitable electric signal of the second polarity applied to the two-terminal memory cell after formation of a conductive filament, can cause ions to enhance the conductive filament (e.g., widening, lengthening, thickening, etc. the conductive filament), in effect forming a second conductive filament measurably distinct from the conductive filament. In further embodiments (e.g., with respect to FIG. 1A and in relation to FIGS. 1B, 1C, 1D, described in more detail infra), one or more additional program signals can further enhance the second conductive filament, creating a third conductive filament, fourth conductive filament, etc., associated with an additional program state(s) (e.g., a third program state, a fourth program state, etc.).

First electrode layer 102B can be formed of Ag, Au, Ti, Ni, Cu, Al, Cr, Ta, Fe, Mn, W, V, Co, Pt, or Pd, (illustrated at FIG. 1D as basic metal first electrode layer 102D) or the like, or a suitable compound of the foregoing, providing electrically induced ions that can migrate into resistive switching layer 104B in response to the suitable electric signal (e.g., a program signal having appropriate polarity). Formation of a conductive filament within resistive switching layer 104B can result in modified electrical characteristics of the resistive switching layer 104B. In at least some embodiments, one of a set of electrical characteristics can result based on characteristics of the conductive filament. For instance, formation of a conductive filament having a particular size, shape, diameter, or traversing a particular width of resistive switching layer 104B can correspond with a particular set of electrical characteristics (e.g., current, current density, resistance, voltage, or the like) that can be measured at the two terminal memory cell. In various embodiments, different sizes, shapes, diameters, widths, etc., of the conductive filament or different values or ranges of values of the electrical characteristics can form or be associated with one of a set of program states. Moreover, the conductive filament can be selected to have one of the set of program states in response to a program signal having a corresponding one of a set of signal characteristics.

In an aspect, a second program signal, e.g., second sweep 103A, having a second polarity can be applied to the memory cell in first state 102A. The second program signal can be configured to induce a relatively low current density (or, e.g., a low change in current density relative to first state 102A) to two-terminal memory cell 100B. In some embodiments, the second program signal can have a relatively high current (e.g., compared to first sweep 101A). In some embodiments, the second program signal can be configured to cause a small change in current density to two-terminal memory cell 100B in a third state 106A compared to first state 102A. This small change in current density can be in absolute terms (e.g., a change in current/area), as a suitable percentage (e.g., relative to a current density of first state 102A), a suitable proportion (e.g., ratio of change in current density between first state 102A and second state 104A, etc., to change in program current between first sweep 101A and second sweep 103A, etc.), or the like, or a suitable combination thereof. This low change in current density between program states of two-terminal memory cell 100B can facilitate resistance to de-programming among states, effectuating OTP characteristics of two-terminal memory cell 100B (e.g., without requiring additional rectifier components, such as a diode).

As mentioned previously, two-terminal memory cell 100B, 100C, 100D (referred to collectively as two-terminal memory cells 100B-100D) can have multiple logical bit states facilitating an MLC device. This can be achieved, for instance, by correlating a set of multiple program states respectively having distinct electrical characteristics (e.g., distinct voltage values, distinct current or current density values, distinct resistance values, and so forth) with a set of MLC logical bits. The correlation further enables selective programming of the two-terminal memory cell (e.g., to one of the MLC logical bits), by programming the two-terminal memory cell to one of the multiple program states, as mentioned above. Furthermore, by measuring an electrical characteristic of the two-terminal memory cell and comparing the measured result with the distinct electrical characteristics of respective ones of the multiple program states, a program state of the conductive filament can be determined. This program state can then be correlated to an associated MLC logical bit to facilitate reading a program state of the two-terminal memory cell.

Various digital information models can be employed to define correlations between the multiple program states and the MLC logical bits of the two-terminal memory cell. One example model correlates respective subsets of the program states to respective MLC logical bits. For instance, a positive integer Y of MLC logical bits can be given by $2^X$, where X is a number of program states which can be reliably and repeatably formed among multiple two-terminal memory cells (e.g., an array of two-terminal memory cells utilized in a memory device). Thus, in this example model, two program states provide one logical bit, four program states provide two logical bits, eight program states provide three logical bits, and so on. As a specific example, first state 102A, second state 104A, third state 106A and fourth state 108A of FIG. 1 A represents a two-bit MLC digital information model. Additional states (not depicted) can facilitate three-bit MLC cells, four-bit MLC cells, and so on. It should be appreciated that the two-terminal memory cell will generally use only a single digital information model to correlate program states to MLC logical bits. However, in addition to the foregoing model(s), other suitable models for correlating a set of filament states to a corresponding set of MLC logical bits other than those disclosed herein can be employed within the scope of the present disclosure.

Referring again to graph 100A at FIG. 1A, in an aspect, each of the plotted lines depict a program state in response to application of an applied voltage. In an aspect, at fabrication, two-terminal memory cells 102B-102D present resistive base states referred to as the first state 102A of the two-terminal cell. In one or more disclosed embodiments, the solid lines represent respective program states, and the dashed lines indicate respective programming signals (e.g., a voltage sweep from zero volts to a predetermined positive or negative voltage, and back to zero volts) for programming the memory cell to an associated next (e.g., higher) program state. A positive dashed line represents a first sweep 101A wherein a positive bias is applied to the first electrode layer of the two-terminal memory cell. Thus, the polarity of first sweep 101A is a positive polarity wherein the two-terminal memory cell results in a state change from first state 102A (e.g., a non-program state, a fabrication state, etc.) to a second state 104A (e.g., a first program state). To achieve the second state 104A, graph 100A illustrates the application of a positive voltage for first sweep 101A, starting at zero volts and increasing to about +7V. In at least one disclosed embodiment, at second state 104A, a current of about 1 nanoAmps (nA) at +1V can be observed, which can be about two orders of magnitude higher than an observed current of first state 102A at +1V. Additionally, second state 104A can have a current compliance to limit current conducted by the two-terminal memory cell when programmed to a maximum current. In one embodiment, the current compliance can be about 50 μA. In other embodiments, the current compliance can be in a range from about 10 μA to about 30 μA, in various embodiments.

In an embodiment, illustrated at FIG. 1A is a third state 106A, which can be achieved by applying a negative voltage bias (e.g., second sweep 103A) to the silver electrode layer of the MLC OTP cell (e.g., two-terminal memory cells 100B-100D). The applied negative voltage is of an opposite polarity to the positive voltage applied to achieve second state 104A. In an embodiment, second sweep 103A can comprise a negative voltage starting at about zero volts and increasing in magnitude up to about −3V to the first electrode of the MLC OTP memory cell. In an aspect, programming the two-terminal memory cell with a negative polarity to achieve third state 106A can result in a current of approximately 10 μA at +1V, about four orders of magnitude higher than the current achieved in the second programming state at +1V. According to various embodiments, applying an opposite polarity bias to the first electrode of the two-terminal memory cell can facilitate a breakdown or partial breakdown of a resistive switching layer of the MLC OTP memory cell.

In an aspect, the breakdown phenomenon is the occurrence of a change to the molecular structure (e.g., changing the bond angle of the molecular components) of a resistive ion migration layer of a memory cell. Furthermore, the resistive ion migration layer can observe decreased electrical resistivity due to such structural change. This can occur, for instance, where the change in molecular structure facilitates ion (e.g. Ag) penetration of the resistive ion migration layer. Second sweep 103A can facilitate programming the MLC OTP cell to third state 106A according to this phenomenon, in some embodiments. Comparatively, programming the MLC OTP cell from first state 102A to second state 104A can be achieved by a different phenomenon; a low current, positive voltage signal employed for first sweep 101A that facilitates minimal ion migration or formation within the resistive ion migration layer. The minimal ion migration can facilitate programming of higher states (e.g., third state 106A, fourth state 108A, etc.) while avoiding or mitigating deprogramming of second state 104A back to first state 102A (e.g., to facilitate OTP memory operation), by maintaining a low current density for the MLC OTP cell. In some embodiments, other program states can facilitate avoiding or deprogramming of the MLC OTP from respective cells by a similar mechanism as for second state 104A, or by a different mechanism. For instance, if second sweep 103A is configured to induce a breakdown or partial breakdown and relatively large ion migration in the MLC OTP cell, an increase in current density can be suppressed via increased filament cross section at similar current (as opposed to small ion migration). Current density can be defined as the electric current (Amps) per unit area of cross section (e.g., Angstroms) of a conductor (e.g., the conductive filament). In the third state 106A, the application of the negative voltage second sweep 103A facilitated the change in molecular structure of the resistive ion migration layer by changing the bond angles of the molecules that comprise the resistive ion migration layer. As a result, the cross section of the conductive filament within the resistive ion migration layer is substantially increased compared to second state 104A, allowing for an increased current at third state 106A while maintaining a low current density.

Furthermore, in an aspect, the two terminal memory cell can achieve a fourth state 108A by applying either a positive or negative voltage for a fourth sweep 105A (e.g., the dashed, bold line of graph 100A) to the first electrode of the MLC OTP cell. As depicted, third sweep 105A can have a higher current compliance (indicated by the flat line at the top of third sweep 105A) than a current compliance provided for second sweep 103A (horizontal dotted bold line at the top of second sweep 103A). The increased current compliance can cause an even larger conductive filament having larger cross section than that of third state 106A (e.g., by breakdown or partial breakdown of resistive ion migration layer of the MLC OTP cell, as described above). Accordingly, the current can be two or more orders of magnitude larger than that of third state 106A, while having a current density sufficiently low to resist or avoid de-programming of the memory cell from fourth state 108A to third state 106A, for instance. Further, increased current with a static or reduced current density can have the additional benefit of stabilizing the program state (e.g., stabilizing a conductive filament of ions), leading to a reliable, durable program state. Thus, the two-terminal memory cell can achieve at least four states as described herein, first state 102A (e.g., a base state), second state 104A (e.g., a first program state), third state 106A (e.g., a second program state), and fourth state 108A (e.g., a third program state). In alternative embodiments, additional states can be achieved by increasing current compliance of a positive or negative program signal, or the like.

In various embodiments, a variety of program signals can be utilized for first sweep 101A, second sweep 103A and third sweep 105A, as alternatives or in addition to those depicted by graph 100A. For instance, in at least one embodiment, second state 104A, third state 106A and fourths state 108A can all be achieved by applying respective positive program signals to an MLC OTP cell (e.g., two-terminal memory cells 100B-100D). In another embodiment, second state 104A, third state 106A and fourths state 108A can all be achieved by applying respective negative program signals to the MLC OTP cell. In other embodiments, at least a subset of these program states (e.g., third state 106A, fourth state 108A, etc.) can be achieved by applying respective negative program signals to the two-terminal memory cell. In an aspect, second state 104A can be achieved by applying a positive signal and third state 106A and fourth state 108A can be achieved by applying respective negative signals. In another aspect, second state 104A can be achieved by applying a positive signal, third state 106A can be achieved by applying a negative signal and fourth state 108A can be achieved by applying a positive signal. Furthermore, other such combinations of achieving the program states can be implemented as well. In various embodiments, the program states can comprise inherent resistance to erasure or de-programming. This resistance can be achieved, for instance, by maintaining relatively low current density. The low current density can be achieved by having low current (e.g., as described above with respect to second state 104A) or high cross-section area (e.g., as described above with respect to third state 106A and fourth state 108A), or a suitable combination thereof. This suitably low current density can facilitate mitigating or preventing a sufficiently high enough current density to deform or decrease the conductive filament.

Figure 1C:
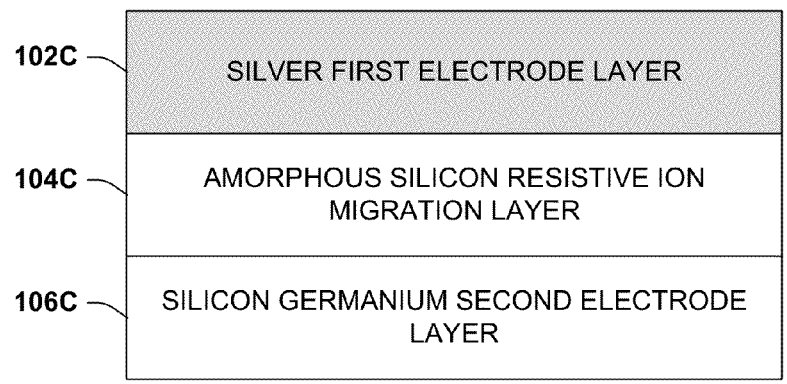
FIG. 1C depicts a non-limiting sample illustration of a two-terminal one-time programmable multi-level memory cell.

In an embodiment, FIG. 1C illustrates an example non-limiting embodiment of memory cell 100C. In an aspect, memory cell 100C comprises a silver electrode layer 102C, an amorphous silicon resistive ion migration layer 104C, and a silicon germanium second electrode layer 106C. In an aspect, the silver (Ag) (or aluminum) electrode layer 102C can serve as a suitable conductive material. Furthermore, in an example, the silver electrode layer 102C can serve as a top electrode for memory cell 100C (e.g., connected to a bitline of a memory device). Adjacent to silver electrode layer 102C, memory cell 100C can comprise an amorphous silicon resistive ion migration layer, a SiOx, or the like 104C. In an aspect, the amorphous silicon resistive ion migration layer 104C can be permeable to silver ions. In another aspect, the amorphous silicon resistive ion migration layer 104C can have a high resistance and at least in part be permeable to ions of the silver electrode layer 102C. Furthermore, adjacent to the amorphous silicon resistive ion migration layer 104C can be a silicon germanium second electrode layer 106C. In an aspect, the silicon germanium second electrode layer 106C can serve as a bottom electrode for memory cell 100C (e.g., connected to a dataline, a wordline, a semiconductor substrate, or the like, as suitable for a desired memory architecture).

Figure 1D:
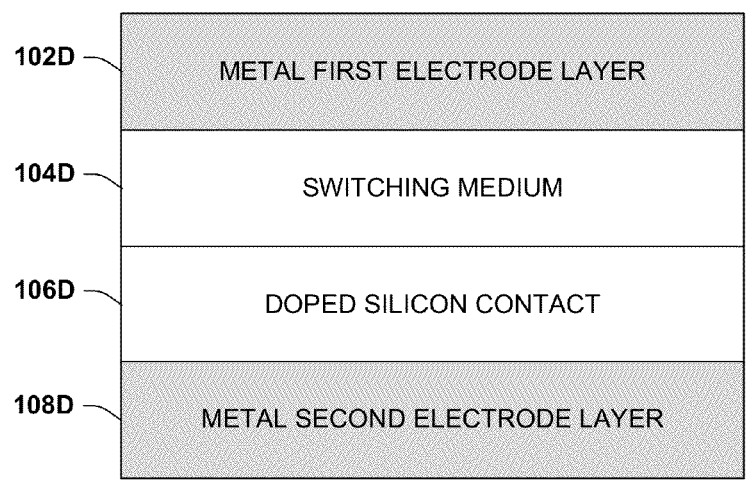
FIG. 1D depicts a non-limiting sample illustration of a two-terminal one-time programmable multi-level memory cell.

In an embodiment, FIG. 1D illustrates an example non-limiting embodiment of memory cell 100D. In an aspect, memory cell 100D comprises a metal first electrode layer 102D, a switching medium 104D, a doped silicon contact layer 106D, and a metal second electrode layer 108D. In an aspect, the metal first electrode layer 102D can serve as a suitable conductive material or as a top electrode for memory cell 100D (e.g., connected to a bitline of a memory device). Examples of metals that can comprise first metal electrode layer 102D can include, among others: silver (Ag), gold (Au), titanium (Ti), nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd)). Other suitable conductive materials, as well as compounds or combinations of the foregoing can be employed for the metal first electrode layer 102D. Adjacent to metal first electrode layer 102D, memory cell 100D can comprise a switching medium 104D. In an aspect, the switching layer 104D can be permeable to ions of the first metal electrode layer 102D.

Furthermore, the ion migration into the switching layer 104D can form one or more filaments (e.g. trap a series of neutral metal particles). Adjacent to switching layer 104D can be doped silicon contact 106D. Furthermore, in an aspect, adjacent to doped silicon contact 106D can be metal second electrode layer 108D. In an aspect, metal second electrode layer 108D of memory cell 100D can be connected to a dataline, a wordline, a semiconductor substrate, or the like, as suitable for a desired memory architecture. The metal of metal second electrode layer 108D can comprise metals, conductively doped silicon or silicon compounds, or the like. In some embodiments, the metal second electrode layer 108D can be formed on a semiconductor substrate.

In view of the exemplary diagram described supra, a process method that can be implemented in accordance with the disclosed subject matter will be better appreciated with reference to the flow charts of FIGS. 2-8. While for purposes of simplicity of explanation, the methods of FIGS. 2-8 is shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the method described herein. Additionally, it should be further appreciated that the method is capable of being stored on an article of manufacture to facilitate transporting and transferring such method to an electronic device. The term article of manufacture, as used, is intended to encompass a computer program accessible from any suitable computer-readable device, device in conjunction with a carrier, storage medium, or the like, or a suitable combination thereof.

Figure 2:
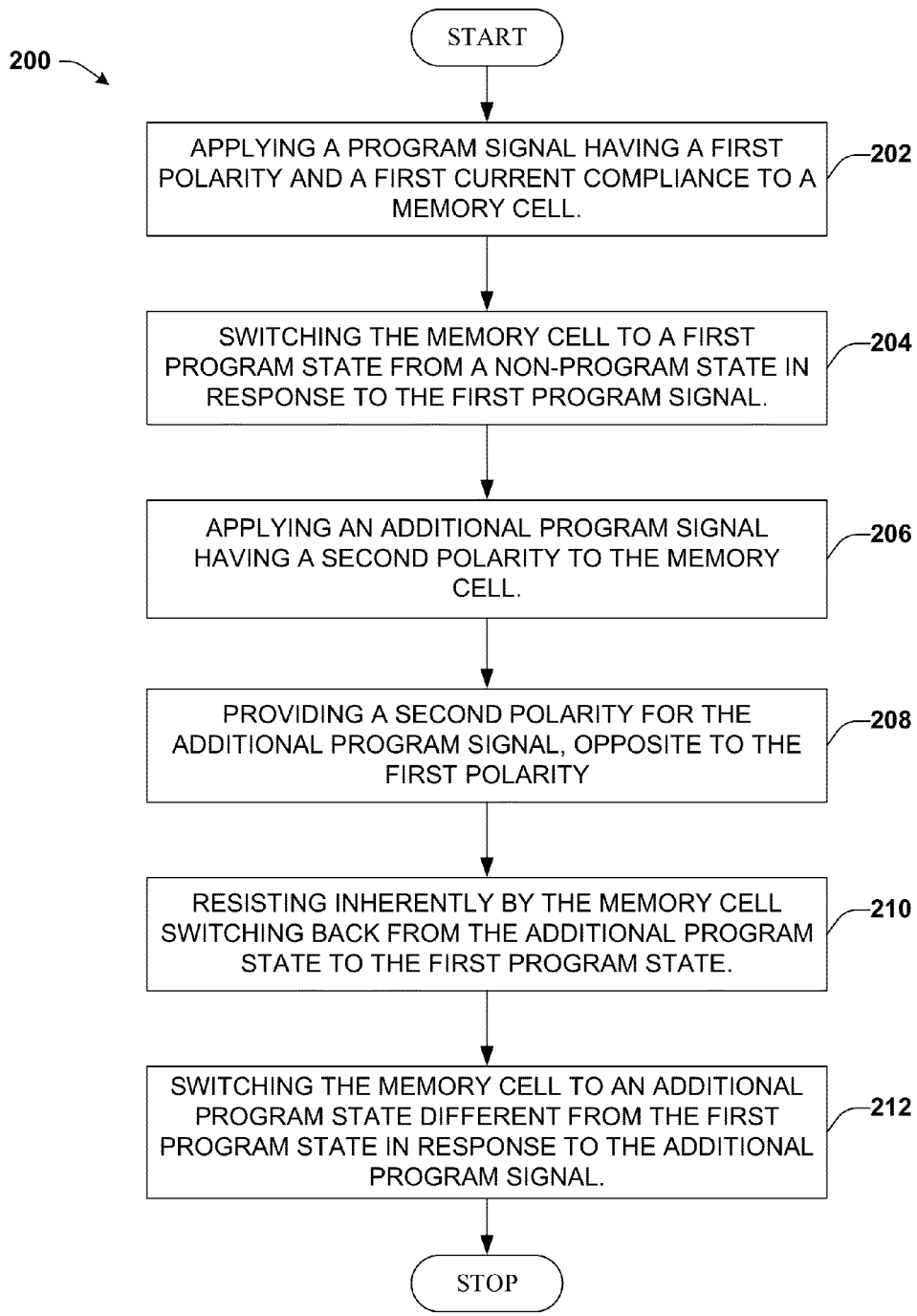
FIG. 2 depicts a flowchart of a sample method for operating a one-time programmable, multi-level cell memory in one or more additional embodiments.

FIG. 2 illustrates a flowchart of a sample method 200 for operating a MLC OTP two-terminal memory cell. At 202, a program signal is applied having a first polarity and a first current compliance to the MLC OTP two-terminal memory cell. At 204, the MLC OTP two-terminal memory cell is switched to a first program state from a non-program state in response to the first program signal. At 206, an additional program signal is applied to the MLC OTP two-terminal memory cell having a second polarity to the memory cell. At 208, a second polarity is provided for the additional program signal, opposite to the first polarity. At 210, the MLC OTP two-terminal memory cell is switched to an additional program state different from the first program state in response to the additional program signal. At 212, the MLC OTP two-terminal memory cell inherently resists switching back from the additional program state to the first program state.

Figure 3:
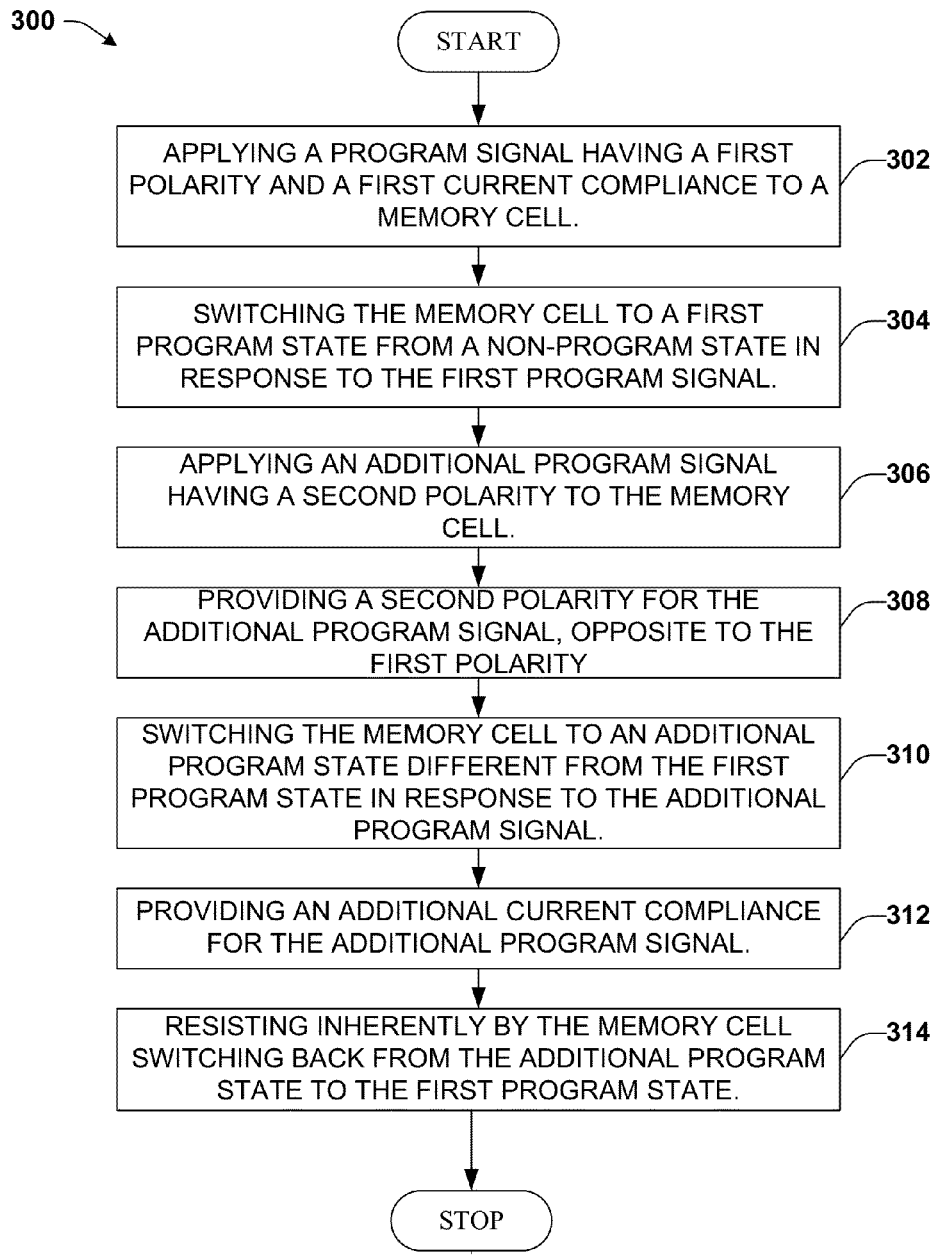
FIG. 3 depicts a flowchart of a sample method for operating a one-time programmable, multi-level cell memory in one or more additional embodiments.

FIG. 3 illustrates a flowchart of a sample method 300 for operating a MLC OTP two-terminal memory cell. At 302, a program signal is applied having a first polarity and a first current compliance to a memory cell. At 304, the memory cell is switched to a first program state from a non-program state in response to the first program signal. At 306, an additional program signal is applied to the memory cell having a second polarity to the memory cell. At 308, a second polarity is provided for the additional program signal, opposite to the first polarity. At 310, the memory cell is switched to an additional program state different from the first program state in response to the additional program signal. At 312, an additional program compliance is provided for the additional program signal. At 314, the memory cell inherently resists switching back from the additional program state to the first program state.

Figure 4:
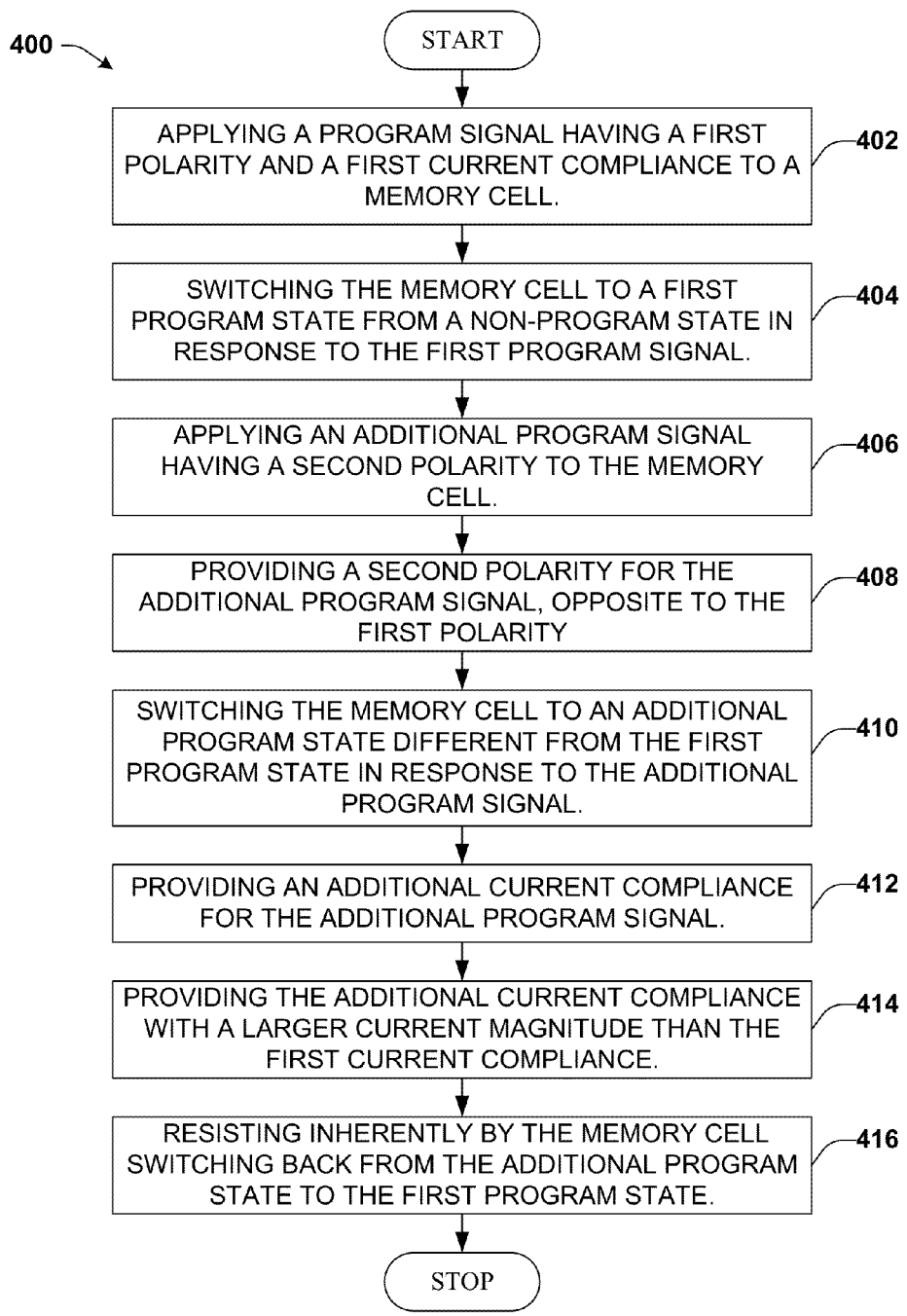
FIG. 4 depicts a flowchart of a sample method for operating a one-time programmable, multi-level cell memory in one or more additional embodiments.

FIG. 4 illustrates a flowchart of a sample method 400 for operating a one time programmable, multi-level cell memory. At 402, a program signal is applied having a first polarity and a first current compliance to a memory cell. At 404, the memory cell is switched to a first program state from a non-program state in response to the first program signal. At 406, an additional program signal is applied to the memory cell having a second polarity to the memory cell. At 408, a second polarity is provided for the additional program signal, opposite to the first polarity. At 410, the memory cell is switched to an additional program state different from the first program state in response to the additional program signal. At 412, an additional current compliance is provided for the additional program signal. At 414, an additional current compliance is provided with a larger current magnitude than the first current compliance. At 416, the memory cell inherently resists switching back from the additional program state to the first program state.

Figure 5:
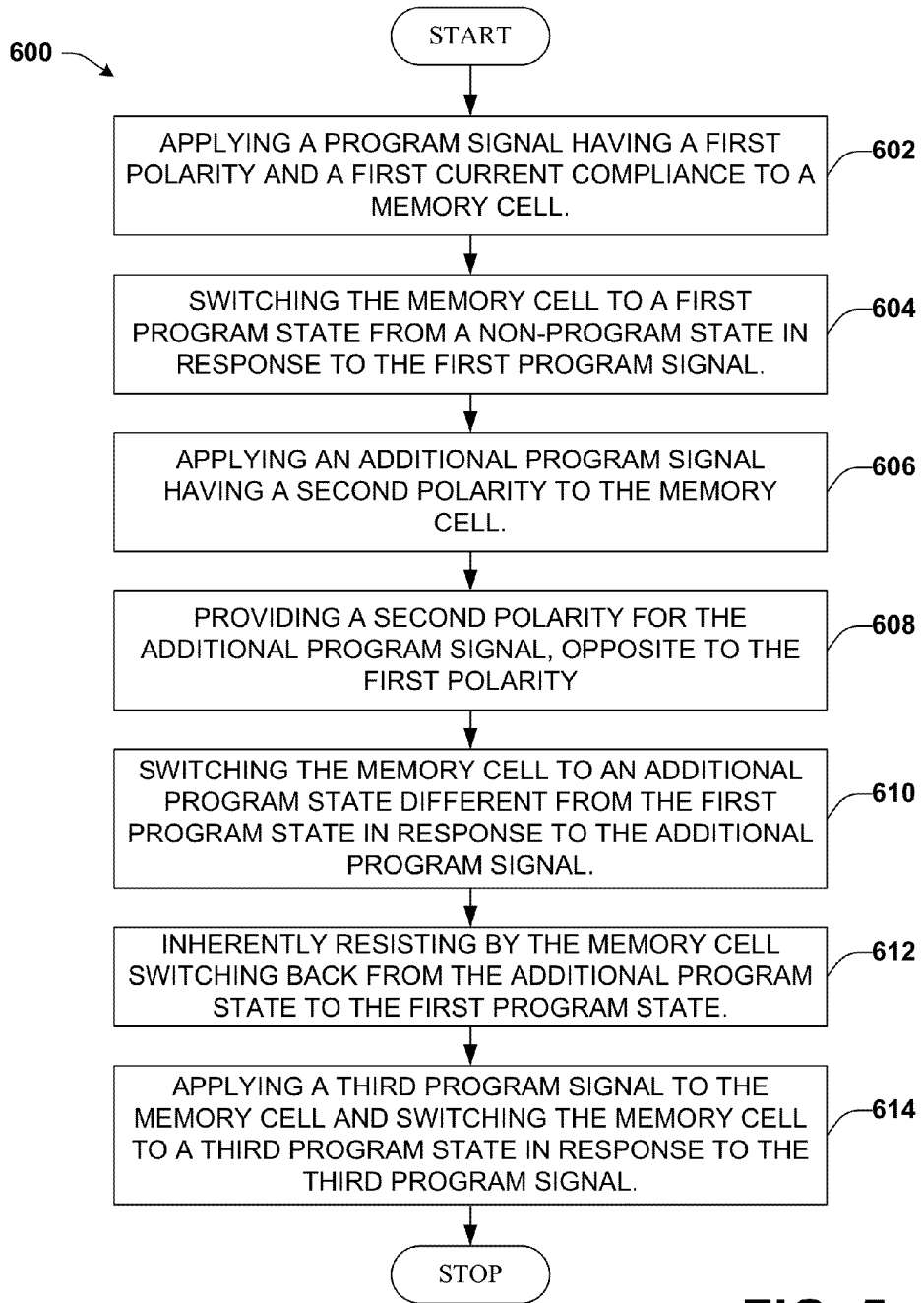
FIG. 5 depicts a flowchart of a sample method for operating a one-time programmable, multi-level cell memory in one or more additional embodiments.

FIG. 5 illustrates a flowchart of a sample method 600 for operating a one time programmable, multi-level cell memory. At 602, a program signal is applied having a first polarity and a first current compliance to a memory cell. At 604, the memory cell is switched to a first program state from a non-program state in response to the first program signal. At 606, an additional program signal is applied to the memory cell having a second polarity to the memory cell. At 608, a second polarity is provided for the additional program signal, opposite to the first polarity. At 610, the memory cell is switched to an additional program state different from the first program state in response to the additional program signal. At 612, the memory cell inherently resists switching back from the additional program state to the first program state. At 614, a third program signal is applied to the memory cell and the memory cell is switched to a third program state in response to the third program signal.

Figure 6:
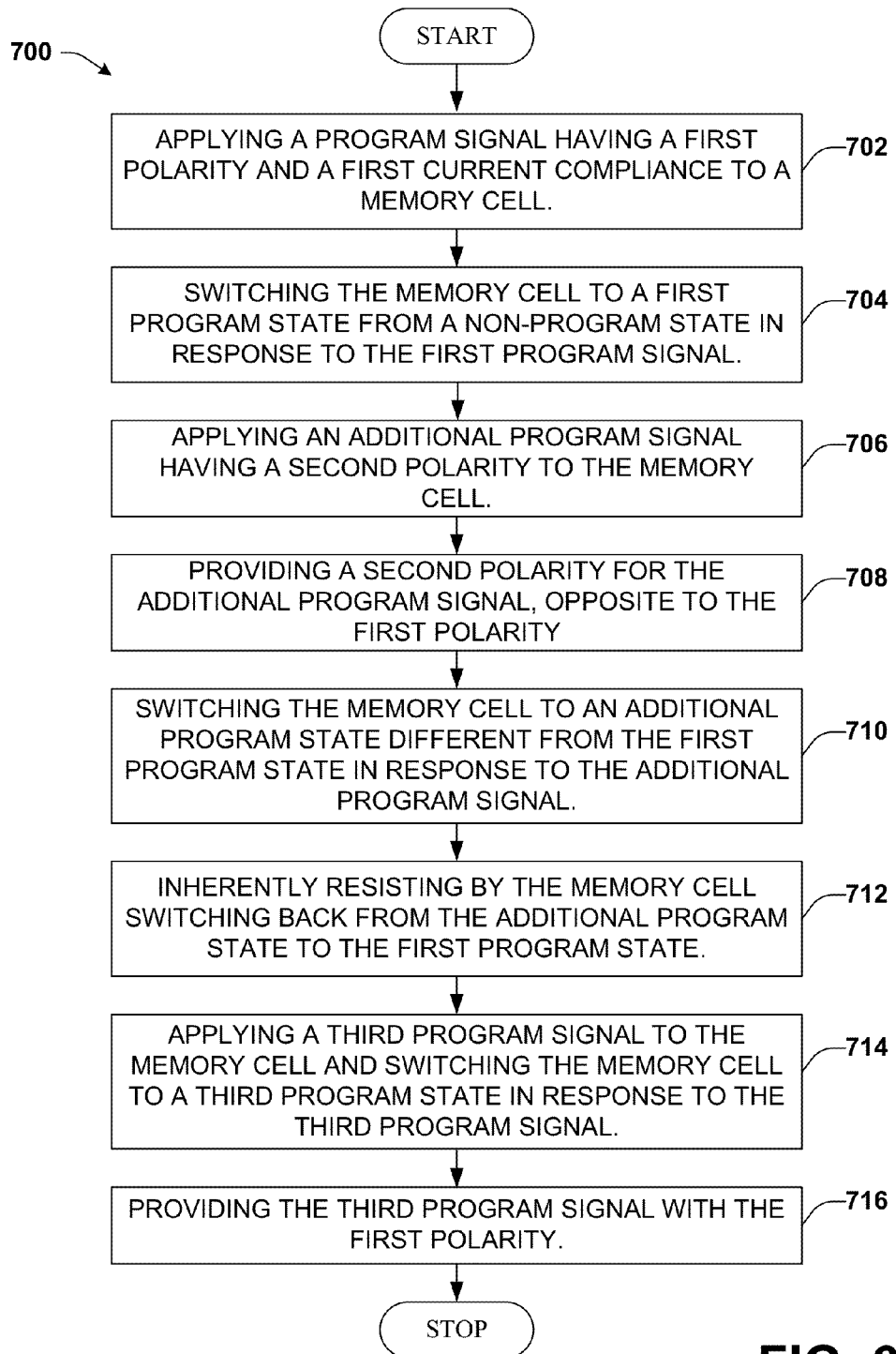
FIG. 6 depicts a flowchart of a sample method for operating a one-time programmable, multi-level cell memory in one or more additional embodiments.

FIG. 6 illustrates a flowchart of a sample method 700 for operating a one time programmable, multi-level cell memory.

At 702, a program signal is applied having a first polarity and a first current compliance to a memory cell. At 704, the memory cell is switched to a first program state from a non-program state in response to the first program signal. At 706, an additional program signal is applied to the memory cell having a second polarity to the memory cell. At 708, a second polarity is provided for the additional program signal, opposite to the first polarity. At 710, the memory cell is switched to an additional program state different from the first program state in response to the additional program signal. At 712, the memory cell inherently resists switching back from the additional program state to the first program state. At 714, a third program signal is applied to the memory cell and the memory cell is switched to a third program state in response to the third program signal. At 716, the third program signal is provided with the first polarity.

Figure 7A:
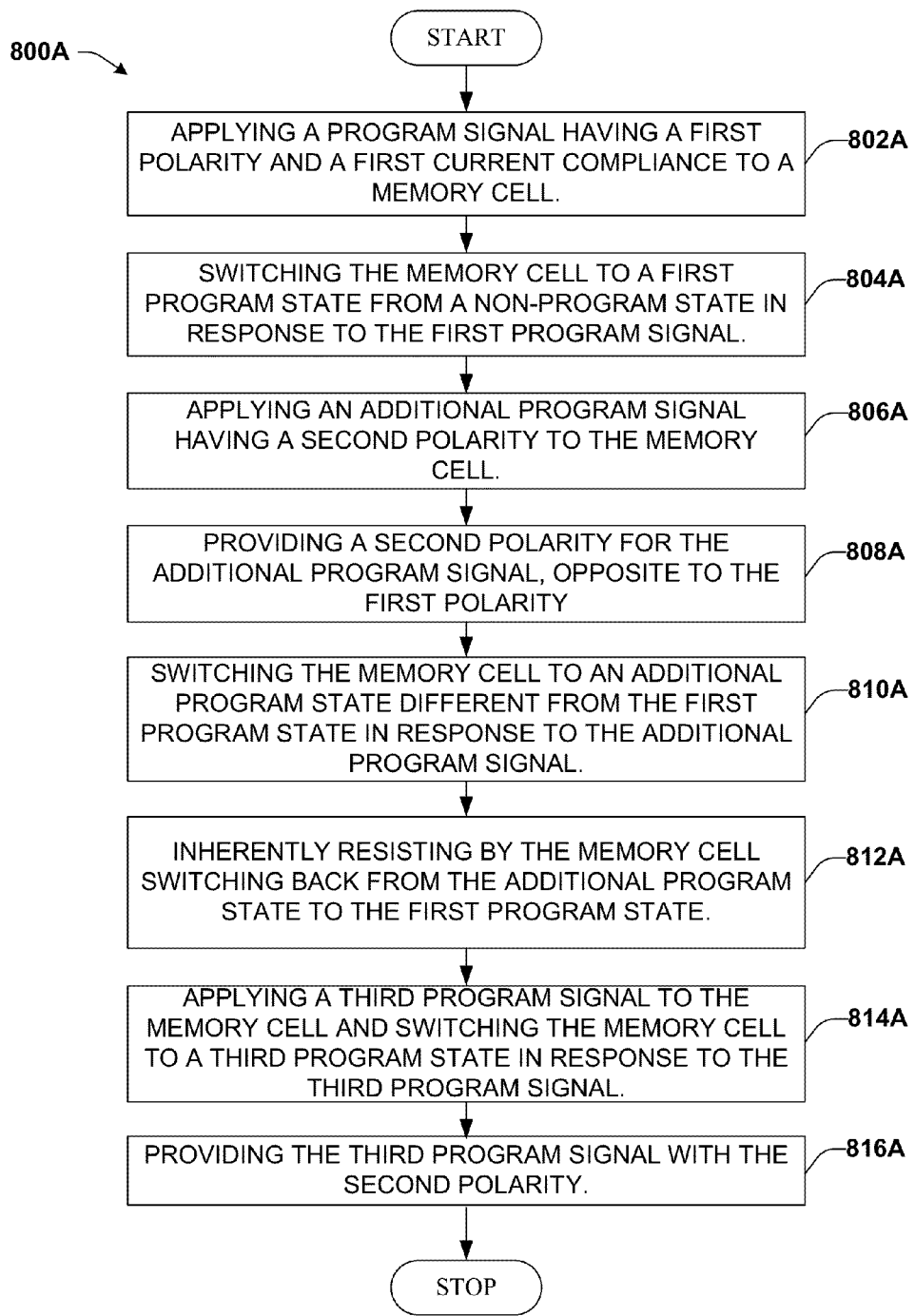
FIG. 7A depicts a flowchart of a sample method for operating a one-time programmable, multi-level cell memory in one or more additional embodiments.

FIG. 7A illustrates a flowchart of a sample method 800A for operating a one time programmable, multi-level cell memory. At 802A, a program signal is applied having a first polarity and a first current compliance to a memory cell. At 804A, the memory cell is switched to a first program state from a non-program state in response to the first program signal. At 806A, an additional program signal is applied to the memory cell having a second polarity to the memory cell. At 808A, a second polarity is provided for the additional program signal, opposite to the first polarity. At 810A, the memory cell is switched to an additional program state different from the first program state in response to the additional program signal. At 812A, the memory cell inherently resists switching back from the additional program state to the first program state. At 814A, a third program signal is applied to the memory cell and the memory cell is switched to a third program state in response to the third program signal. At 816A, the third program signal is provided with the second polarity.

Figure 7B:
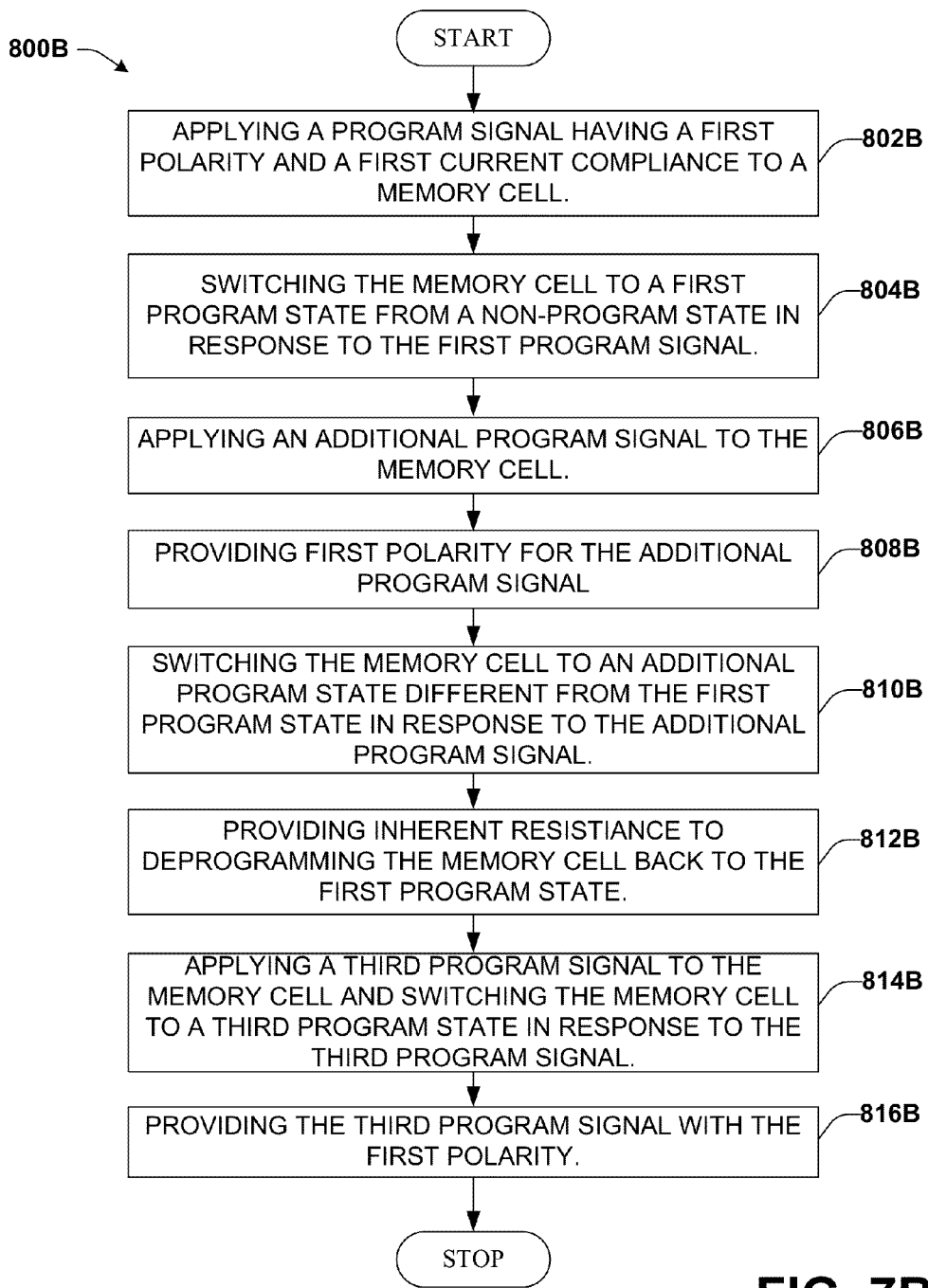
FIG. 7B depicts a flowchart of a sample method for operating a one-time programmable, multi-level cell memory in one or more additional embodiments.

FIG. 7B illustrates a flowchart of a sample method 800B for operating a MLC memory to achieve OTP functionality. At 802B, a program signal is applied having a first polarity and a first current compliance to a memory cell. In an embodiment, the program signal can facilitate relatively low ion migration within a switching medium of the memory cell. At 804B, the memory cell is switched to a first program state from a non-program state in response to the first program signal. In a further embodiment, the memory cell can have low current density in the first program state, sufficient to mitigate or avoid deprogramming of the first program state. At 806B, an additional program signal is applied to the memory cell. At 808B, the first polarity is provided for the additional program signal. At 810B, the memory cell is switched to an additional program state different from the first program state in response to the additional program signal. At 812B, method 800B can comprise providing the memory cell inherent resistance to switching back from the additional program state to the first program state. At 814B, a third program signal is applied to the memory cell and the memory cell is switched to a third program state in response to the third program signal. At 816B, the third program signal is provided with the first polarity.

Figure 8:
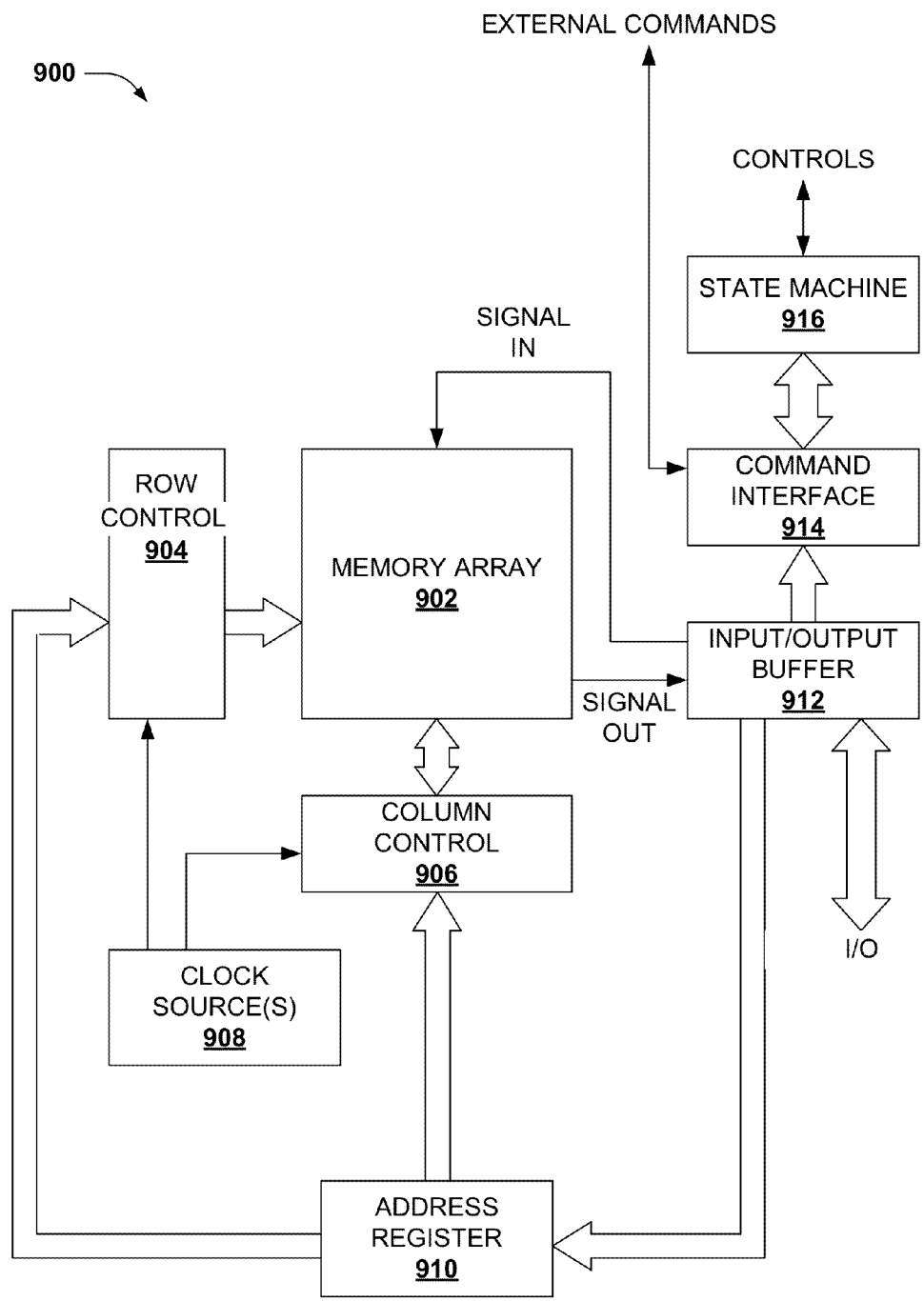
FIG. 8 depicts a block diagram of a sample operating environment for facilitating implementation of one or more disclosed embodiments.

In order to provide a context for the various aspects of the disclosed subject matter, FIG. 8, as well as the following discussion, is intended to provide a brief, general description of a suitable environment in which various aspects of the disclosed subject matter can be implemented or processed. While the subject matter has been described above in the general context of semiconductor architectures and process methods for fabricating or operating such architectures, those skilled in the art will recognize that the subject disclosure also can be implemented in combination with other architectures or process methods. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 8 and 9, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Such considerations have been addressed by the disclosed aspects.

FIG. 8 illustrates a block diagram of an example operating and control environment 900 for a memory cell array 902 according to aspects of the subject disclosure. In at least one aspect of the subject disclosure, memory cell array 902 can comprise a variety of memory cell technology. Particularly, memory cell array 902 can comprise two-terminal memory such as resistive-switching memory cells. In various embodiments, memory cell array 902 can be a NAND array comprising two-terminal memory. In at least one embodiment, memory cell array 902 can be a NAND array having respective memory cells that comprise a 1T-1D parallel circuit, as described herein.

A column controller 906 can be formed adjacent to memory cell array 1002. Moreover, column controller 906 can be electrically coupled with bit lines of memory cell array 902. Column controller 906 can control respective bitlines, applying suitable program, erase or read voltages to selected bitlines.

In addition, operating and control environment 900 can comprise a row controller 904. Row controller 904 can be formed adjacent to column controller 906, and electrically connected with word lines of memory cell array 902. Row controller 904 can select particular rows of memory cells with a suitable selection voltage. Moreover, row controller 904 can facilitate program, erase or read operations by applying suitable voltages at selected word lines.

A clock source(s) 909 can provide respective clock pulses to facilitate timing for read, write, and program operations of row control 904 and column control 906. Clock source(s) 909 can further facilitate selection of word lines or bit lines in response to external or internal commands received by operating and control environment 900. An input/output buffer 912 can be connected to an external host apparatus, such as a computer or other processing device (not depicted) by way of an I/O buffer or other I/O communication interface. Input/output buffer 912 can be configured to receive write data, receive an erase instruction, output readout data, and receive address data and command data, as well as address data for respective instructions. Address data can be transferred to row controller 904 and column controller 906 by an address register 910. In addition, input data is transmitted to memory cell array 902 via signal input lines, and output data is received from memory cell array 902 via signal output lines. Input data can be received from the host apparatus, and output data can be delivered to the host apparatus via the I/O buffer.

Commands received from the host apparatus can be provided to a command interface 914. Command interface 914 can be configured to receive external control signals from the host apparatus, and determine whether data input to the input/output buffer 912 is write data, a command, or an address. Input commands can be transferred to a state machine 916.

State machine 916 can be configured to manage programming and reprogramming of memory cell array 902. State machine 916 receives commands from the host apparatus via input/output interface 912 and command interface 914, and manages read, write, erase, data input, data output, and like functionality associated with memory cell array 902. In some aspects, state machine 916 can send and receive acknowledgments and negative acknowledgments regarding successful receipt or execution of various commands.

To implement read, write, erase, input, output, etc., functionality, state machine 916 can control clock source(s) 908. Control of clock source(s) 908 can cause output pulses configured to facilitate row controller 904 and column controller 906 implementing the particular functionality. Output pulses can be transferred to selected bit lines by column controller 906, for instance, or word lines by row controller 904, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

Figure 9:
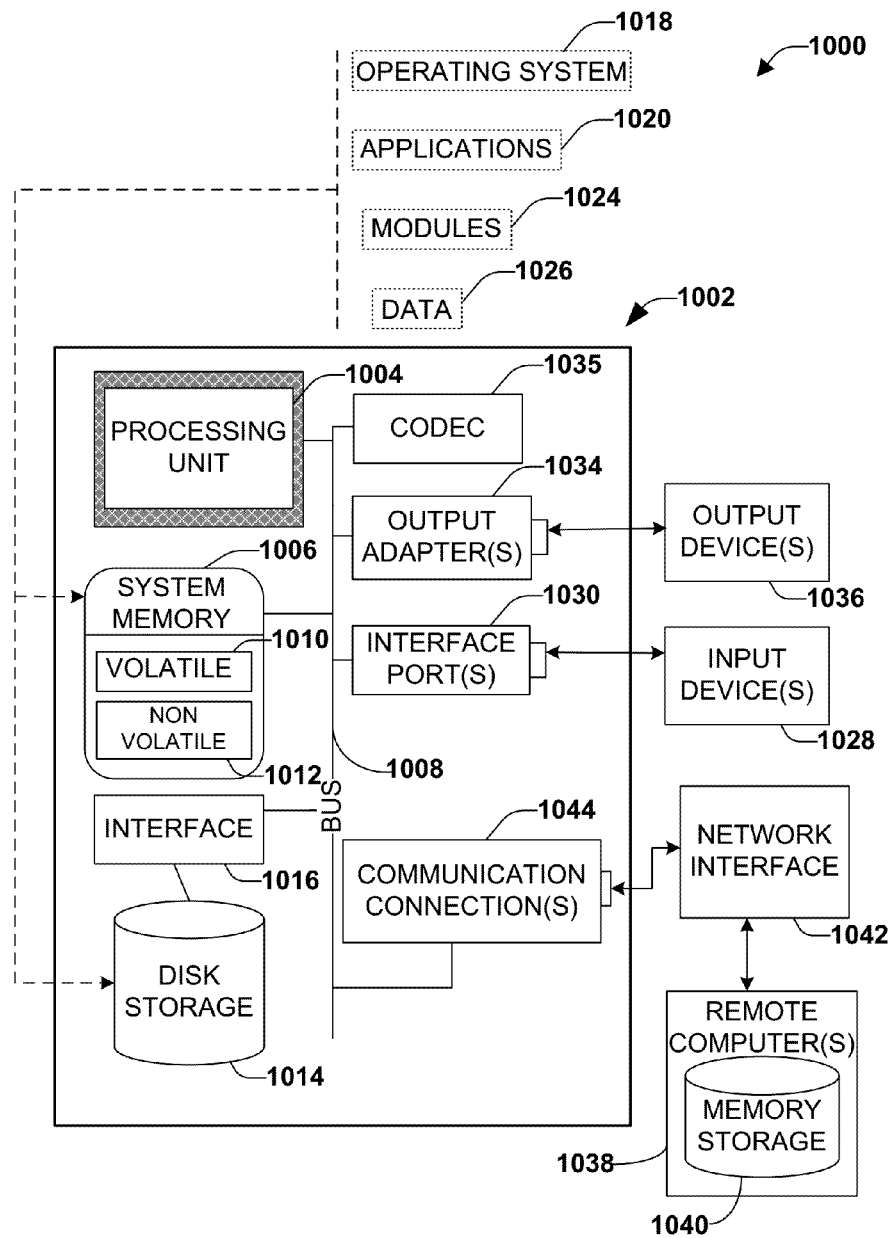
FIG. 9 illustrates a block diagram of an example computing environment that can be implemented in conjunction with various embodiments.

In connection with FIG. 9, the systems and processes described herein can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

With reference to FIG. 9, a suitable environment 1000 for implementing various aspects of the claimed subject matter includes a computer 1002. The computer 1002 includes a processing unit 1004, a system memory 1006, a codec 1035, and a system bus 1008. The system bus 1008 couples system components including, but not limited to, the system memory 1006 to the processing unit 1004. The processing unit 1004 can be any of various available processors. Dual microprocessors and other multiprocessor architectures also can be employed as the processing unit 1004.

The system bus 1008 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1106 includes volatile memory 1010 and non-volatile memory 1012, which can employ one or more of the disclosed memory architectures, in various embodiments. The basic input/output system (BIOS), containing the basic routines to transfer information between elements within the computer 1002, such as during start-up, is stored in non-volatile memory 1012. In addition, according to present innovations, codec 1035 may include at least one of an encoder or decoder, wherein the at least one of an encoder or decoder may consist of hardware, software, or a combination of hardware and software. Although, codec 1035 is depicted as a separate component, codec 1035 may be contained within non-volatile memory 1012. By way of illustration, and not limitation, non-volatile memory 1012 can include read only memory (ROM), programmable ROM (PROM), electrically programmable ROM (EPROM), electrically erasable programmable ROM (EEPROM), or Flash memory. Non-volatile memory 1012 can employ one or more of the disclosed memory architectures, in at least some disclosed embodiments. Moreover, non-volatile memory 1012 can be computer memory (e.g., physically integrated with computer 1002 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1010 includes random access memory (RAM), which acts as external cache memory. According to present aspects, the volatile memory may store the write operation retry logic (not shown in FIG. 10) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1002 may also include removable/non-removable, volatile/non-volatile computer storage medium. FIG. 9 illustrates, for example, disk storage 1014. Disk storage 1014 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1014 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1014 to the system bus 1008, a removable or non-removable interface is typically used, such as interface 1016. It is appreciated that storage devices 1014 can store information related to a user. Such information might be stored at or provided to a server or to an application running on a user device. In one embodiment, the user can be notified (e.g., by way of output device(s) 1036) of the types of information that are stored to disk storage 1014 and/or transmitted to the server or application. The user can be provided the opportunity to opt-in or opt-out of having such information collected and/or shared with the server or application (e.g., by way of input from input device(s) 1028).

It is to be appreciated that FIG. 9 describes software that acts as an intermediary between users and the basic computer resources described in the suitable operating environment 1000. Such software includes an operating system 1018. Operating system 1018, which can be stored on disk storage 1014, acts to control and allocate resources of the computer system 1002. Applications 1020 take advantage of the management of resources by operating system 1018 through program modules 1024, and program data 1026, such as the boot/shutdown transaction table and the like, stored either in system memory 1006 or on disk storage 1014. It is to be appreciated that the claimed subject matter can be implemented with various operating systems or combinations of operating systems.

A user enters commands or information into the computer 1002 through input device(s) 1028. Input devices 1028 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1004 through the system bus 1008 via interface port(s) 1030. Interface port(s) 1030 include, for example, a serial port, a parallel port, a game port, and a universal serial bus (USB). Output device(s) 1036 use some of the same type of ports as input device(s) 1028. Thus, for example, a USB port may be used to provide input to computer 1002 and to output information from computer 1002 to an output device 1036. Output adapter 1034 is provided to illustrate that there are some output devices 1036 like monitors, speakers, and printers, among other output devices 1036, which require special adapters. The output adapters 1034 include, by way of illustration and not limitation, video and sound cards that provide a means of connection between the output device 1036 and the system bus 1008. It should be noted that other devices and/or systems of devices provide both input and output capabilities such as remote computer(s) 1038.

Computer 1002 can operate in a networked environment using logical connections to one or more remote computers, such as remote computer(s) 1038. The remote computer(s) 1038 can be a personal computer, a server, a router, a network PC, a workstation, a microprocessor based appliance, a peer device, a smart phone, a tablet, or other network node, and typically includes many of the elements described relative to computer 1002. For purposes of brevity, only a memory storage device 1040 is illustrated with remote computer(s) 1038. Remote computer(s) 1038 is logically connected to computer 1002 through a network interface 1042 and then connected via communication connection(s) 1044. Network interface 1042 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1044 refers to the hardware/software employed to connect the network interface 1042 to the bus 1008. While communication connection 1044 is shown for illustrative clarity inside computer 1002, it can also be external to computer 1002. The hardware/software necessary for connection to the network interface 1042 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, and so forth) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips), optical disks (e.g., compact disk (CD), digital versatile disk (DVD)), smart cards, and flash memory devices (e.g., card, stick, key drive). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method, comprising:
applying a program signal having a first polarity and a first current compliance to a memory cell;
switching the memory cell to a first program state from a non-program state in response to the first program signal by forming a filament in a resistive switching layer of the memory cell;
applying an additional program signal having a second polarity to the memory cell; and
switching the memory cell to an additional program state different from the first program state in response to the additional program signal by modifying at least one parameter of the filament in the resistive switching layer of the memory cell, wherein:
the memory cell inherently resists switching back from the additional program state to the first program state, the second polarity is opposite to the first polarity.

2. The method of claim 1, further comprising providing an additional current compliance for the additional program signal.

3. The method of claim 2, further comprising providing the additional current compliance with a larger current magnitude than a current magnitude of the first current compliance.

4. The method of claim 1, wherein the at least one parameter of the filament comprises at least one of a length of the filament, a width of the filament, an ion density of the filament, a current density of the filament, a shape of the filament, a size of the filament, or a diameter of the filament.

5. The method of claim 1, further comprising applying a third program signal to the memory cell and switching the memory cell to a third program state in response to the third program signal by making an additional modification to the at least one parameter of the filament in the resistive switching layer of the memory cell.

6. The method of claim 5, further comprising providing the third program signal with the first polarity.

7. The method of claim 5, further comprising providing the third program signal with the second polarity.

8. The method of claim 5, wherein at least one of:
the first program state provides a first current response for the memory cell of about 1 nanoAmp (nA) at 1 volt;
the additional program state provides a second current response of about 10 microAmps (µA) at 1 volt; or
the third program state provides a third current response of about 1 milliAmp (mA) at 1 volt.

9. The method of claim 5, further comprising applying at least one further program signal to the memory cell to facilitate switching the memory cell to at least one further state of the memory cell by making at least one other modification to the at least one parameter of the filament in the resistive switching layer of the memory cell.

10. The method of claim 5, further comprising providing the first current compliance with a current magnitude in a range of about 10 µA to about 30 µA.

11. The method of claim 5, further comprising providing an additional current compliance for the additional program signal with a current magnitude in a range of about 30 µA to about 50 µA.

12. The method of claim 5, further comprising providing a third current compliance for the third program signal with a current magnitude in a range of about 50 µA to about 75 µA.

13. An electronic device, comprising:
a memory cell configured to be programmed amongst a sequence of a plurality of irreversible program states;
a controller configured to:
receive a first command instruction at a command interface of the electronic device indicating to place the memory cell into a first program state;
in response to the first command instruction, apply a first program signal with a first polarity to the memory cell to place the memory cell in the first program state by formation of a filament in a resistive switching layer of the memory cell;
receive a second command instruction at the command interface indicating to place the memory cell into a second program state; and
in response to the second command instruction, apply a second program signal with a second polarity opposite the first polarity to the memory cell to place the memory cell in the second program state by modification of at least one parameter of the filament in the resistive switching layer of the memory cell.

14. The electronic device of claim 13, wherein the controller is further configured to:
receive a third command instruction at the command interface indicating to place the memory cell into a third program state; and
in response to the second command instruction, apply a third program signal to the memory cell to place the memory cell in the third program state by an additional modification to the at least one parameter of the filament in the resistive switching layer of the memory cell.

15. The electronic device of claim 13, wherein the at least one parameter of the filament comprises at least one of a length of the filament, a width of the filament, an ion density of the filament, a current density of the filament, a shape of the filament, a size of the filament, or a diameter of the filament.

16. The electronic device of claim 13, wherein the controller is further configured to:
receive at least one additional command instruction at the command interface indicating to place the memory cell into at least one additional program state; and
in response to the at least one additional command instruction, apply one or more further program signals to the memory cell to place the memory cell in the at least one additional program state by at least one other modification to the at least one parameter of the filament in the resistive switching layer of the memory cell.

17. The electronic device of claim 13, wherein the controller is further configured to provide a first current compliance to the first program signal with a current magnitude of 10 µA to about 30 µA and a second current compliance to the second program signal with a current magnitude of 30 µA to about 50 µA.

18. The electronic device of claim 13, wherein the controller is further configured to at least one of verify the memory is in the first program state in response to the first program signal or verify the memory is in the second program state in response to the second program signal.

19. A method, comprising:
    applying a first program signal to a memory cell having a first polarity and a first current compliance configured to cause a state change in the one time programmable, multi-level cell memory to a first program state from a non-program state by forming a filament in a resistive switching layer of the memory cell;
    applying a second program signal to the memory cell having a second polarity and a second current compliance configured to cause a state change in the one time programmable, multi-level cell memory to a second program state from the first program state; and
    switching the memory cell to the second program state different from the first program state in response to the second program signal by modifying at least one parameter of the filament in the resistive switching layer of the memory cell, wherein:
        the memory cell comprises a monolithic stack constructed above a substrate,
        the memory cell resists de-programming,
        the second polarity is the opposite as the first polarity.

20. The method of claim 19, further comprising:
    applying a third program signal to the one-time programmable, multi-level cell memory having the first polarity and a third current compliance configured to cause a state change in the one time programmable, multi-level cell memory to a third program state from the second program state; and
    switching the memory cell to the third program state different from the second program state in response to the third program signal by making an additional modification to the at least one parameter of the filament in the resistive switching layer of the memory cell.

* * * * *